United States Patent [19]

Lee

[11] Patent Number: 4,737,837
[45] Date of Patent: Apr. 12, 1988

[54] RING TOPOLOGY FOR AN INTEGRATED CIRCUIT LOGIC CELL

[75] Inventor: Gary M. Lee, Circle Pines, Minn.
[73] Assignee: Honeywell Inc., Minneapolis, Minn.
[21] Appl. No.: 802,566
[22] Filed: Nov. 27, 1985
[51] Int. Cl.[4] .................. H01L 27/02; H01L 29/78; H01L 29/48; H03K 19/017
[52] U.S. Cl. .................. 357/46; 357/23.1; 357/41; 357/45; 357/15; 357/238; 307/304; 307/448; 307/468
[58] Field of Search .......... 357/23.14, 42, 45, 15, 357/23.1, 23.8, 41; 307/304, 448, 468

[56] References Cited

U.S. PATENT DOCUMENTS

| | | | |
|---|---|---|---|
| 3,406,298 | 10/1968 | Axelrod | 307/448 |
| 3,969,745 | 7/1976 | Blocker, III | 357/22 |
| 3,995,174 | 11/1976 | Zrudsky | 307/240 |
| 4,079,408 | 3/1978 | Kwap et al. | 357/50 |
| 4,152,714 | 5/1979 | Hendrickson et al. | 357/23 |
| 4,315,272 | 2/1982 | Vorhaus | 357/22 |
| 4,322,738 | 3/1982 | Bell et al. | 357/22 |
| 4,566,022 | 1/1986 | Kalter et al. | 357/23.14 |

*Primary Examiner*—Martin H. Edlow
*Assistant Examiner*—D. Featherstone
*Attorney, Agent, or Firm*—William T. Udseth; John G. Shudy, Jr.

[57] ABSTRACT

An improved topology for a multi-input Boolean logic circuit whereby the circuit can be realized in integrated circuit form while consuming less area on the semiconductor wafer and exhibiting lower parasitic capacitance than equivalent integrated circuits using conventional topology. Rather than employing what might be described as an "in-line" topology of the prior art, a ring topology is used wherein adjacent MESFET's share a common region for source, drain, or source/drain contacts and wherein the amount of second level interconnect required is minimized.

21 Claims, 4 Drawing Sheets

2 INPUT NAND

LEGEND:
- ☐ OHMIC CONTACT REGION
- ▨ n DIFFUSION
- ▨ GATE METAL
- ▨ 1st LEVEL METAL
- ■ CONTACT VIA
- ░ 2nd LEVEL METAL

RING TOPOLOGY FOR AN INTEGRATED CIRCUIT LOGIC CELL

The Government has rights to this invention pursuant to Contract No. F29601-84-C-0010 awarded by the Department of the Air Force.

BACKGROUND OF THE INVENTION

I. Field of the Invention

This invention relates generally to the formation of digital logic circuits in integrated circuit form, and more particularly to a new and improved topology which affords a significant reduction in the size (area) occupied by a logic gate as compared to that required for prior art designs.

II. Discussion of the Prior Art

In the design of very complex digital logic circuits, often referred to as very large scale integrated circuits, it is a common practice to use a basic logic cell such as NOR gate or NAND gate. As an elemental building block, such NOR and NAND gates can be readily combined to realize any complex Boolean logic function. A common circuit used to realize this cell in VLSI technologic is the direct coupled, field effect transistor logic circuit (DCFL). As those skilled in the art recognize, this circuit is realized in an integrated form by selective diffusion and patterning of metallic conductors. Multiple layers of deposited metal are used to interconnect the FET devices comprising the elemental cell as well as to interconnect multiple cells to forms a complete integrated circuit.

It is also desirable that the logic signals propagate through the logic gates with the shortest possible delay and with the lowest possible power consumption. The critical factor in speed/power performance is the parasitic capacitance associated with the deposited metal interconnects. Parasitic capacitance can be minimized by making the elemental logic cell as compact as possible, consistent with the manufacturing tolerances, also referred to as "design rules".

In accordance with the present invention, a significantly more compact layout for a basic NOR and NAND gate logic cells is achieved by adopting a unique ring topology which allows the cell to be fabricated on a semiconductor wafer with less area and with fewer interconnects than has been the case with known prior art NOR and NAND gates of equivalent complexity. Rather than the grid topology of prior art circuits, the ring topology of the present invention allows adjacent field effect transistors to use a common region for source, drain or source/drain contacts whereby area is minimized. In addition, the ring topology provides a degree of symmetry which results in uniformly lower parasitic capacitance for each element of the composite logic gate. As mentioned, this is important in that the usable speed of the gate is determined by the propagation delay through the slowest input path. Furthermore, the ring topology of the present invention affords the advantages that it simplifies the interconnection of the individual FET's comprising the composite NOR or NAND gates to minimize the amount of second level interconnect required. This, in turn, provides improved routability in the formation of the gate-to-gate interconnections on the semiconductor wafer.

The use of a ring topology is not, by itself, new. In the Zrudsky U.S. Pat. No. 3,995,174 there is described a balanced bridge chopper which may be produced as a monolithic planar-silicon integrated circuit in which gate-to-channel capacitance balancing is accomplished during manufacturing in place of the use of variable trimming capacitors. A bridge circuit is, of course, inherently a ring configuration whereas prior art, multi-input, logic gates such as a NOR or a NAND gate have conventionally been configured in an grid topology. The Zrudsky Patent does not address the matter of reducing area while minimizing parasitic capacitance.

The Vorhaus U.S. Pat. No. 4,315,272 describes a demodulator circuit (FIG. 3) involving a dual gate field effect transistor configured as a microwave switching device rather than as a logic gate building block. The device is configured such that a common source electrode is surrounded about its periphery by a plurality of separate drain electrodes. While this bears a relationship to the ring topology utilized in the present invention, it does not result in a reduction in parasitic capacitance through the conservation of area.

OBJECTS

It is accordingly the principal object of the present invention to provide a new and improved topology for a VLSI multi-input logic gate.

Another object of the invention is to provide a multi-input NOR gate and a multi-input NAND gate in integrated circuit form which consumes less area on the semiconductor substrate than equivalent logic gates and which exhibits substantially lower parasitic capacitance.

Yet another object of the invention is to provide a multi-input NOR or NAND gate using a ring topology rather than an grid topology.

SUMMARY OF THE INVENTION

The invention described and claimed herein is directed to a basic logic cell which may be fabricated using conventional VLSI technology but with a unique topological configuration wherein each adjacent field effect transistor comprising the cell uses a common region for source or drain contacts. Because of the symmetrical placement of the source and drain contact regions about the plural gates comprising the multi-input cell, the topology is referred to as a ring configuration. This topology provides the maximum number of common source-drains in two dimensions and results in an area savings of 40% over conventional layouts when implementing the same multi-input logic cell. Still further area savings result from the fact that the source-drain regions across the FET can be connected in the second metal without routing over the gates or beyond the edges of the FET's. With a four-input NOR cell or a two-input NAND cell, the gate electrodes are oriented at a 45° angle which effectively reduces the width of each FET by $1/\sqrt{2}$. Furthermore, because the gates are at 45°, circuit inputs to the gates can be attached at the bottom, top or sides of the ring configuration which results in a savings of routing tracks.

These and other objects and advantages of the invention will become apparent to those skilled in the art from the following detailed description of a preferred embodiment, especially when considered in conjunction with the accompanying drawings in which like numbers in the several views refer to corresponding parts.

DESCRIPTION OF THE PREFERRED EMBODIMENT

Figure 1:
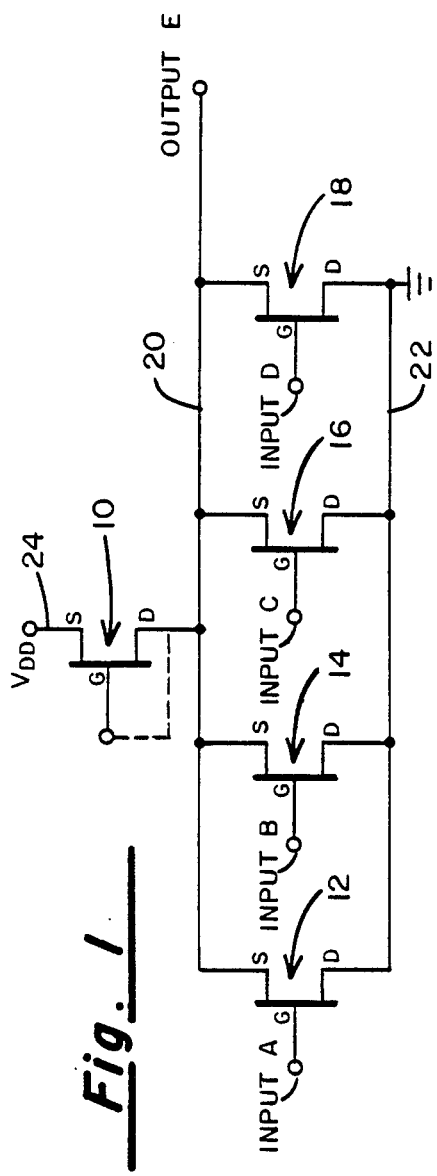
FIG. 1 is a schematic diagram of a conventional four-input NOR gate.

Referring first to FIG. 1, there is shown a schematic diagram of a conventional, prior art, four-input NOR circuit of the DCFL type. It performs the Boolean logic function $E = \overline{A+B+C+D}$. Field effect transistor (FET) 10 is biased with a DC voltage, $V_B$, to provide a constant current source or load for the logic circuit. A conventional alternative is to design FET 10 to operate in the so-called "depletion mode" in which it is normally conducting with a zero gate bias. In this case, the gate G of FET 10 can be connected directly to the conductor 20 on which the output signal is developed. If a logical "0", i.e., 0 volts, is present at each of the gate inputs A, B, C and D, then each associated FET 12, 14, 16 and 18 will be non-conducting and the current flowing through FET 10 is available to charge conductor 20 and the associated parasitic capacitance loading output E to a positive voltage, i.e., a logical "1". A positive voltage at any input, i.e., a logical "1" will cause its associated FET 12, 14, 16 or 18 to conduct, thereby discharging the capacitance associated with conductor 20 and diverting the current through FET 10 to the ground conductor 22.

Figure 2:
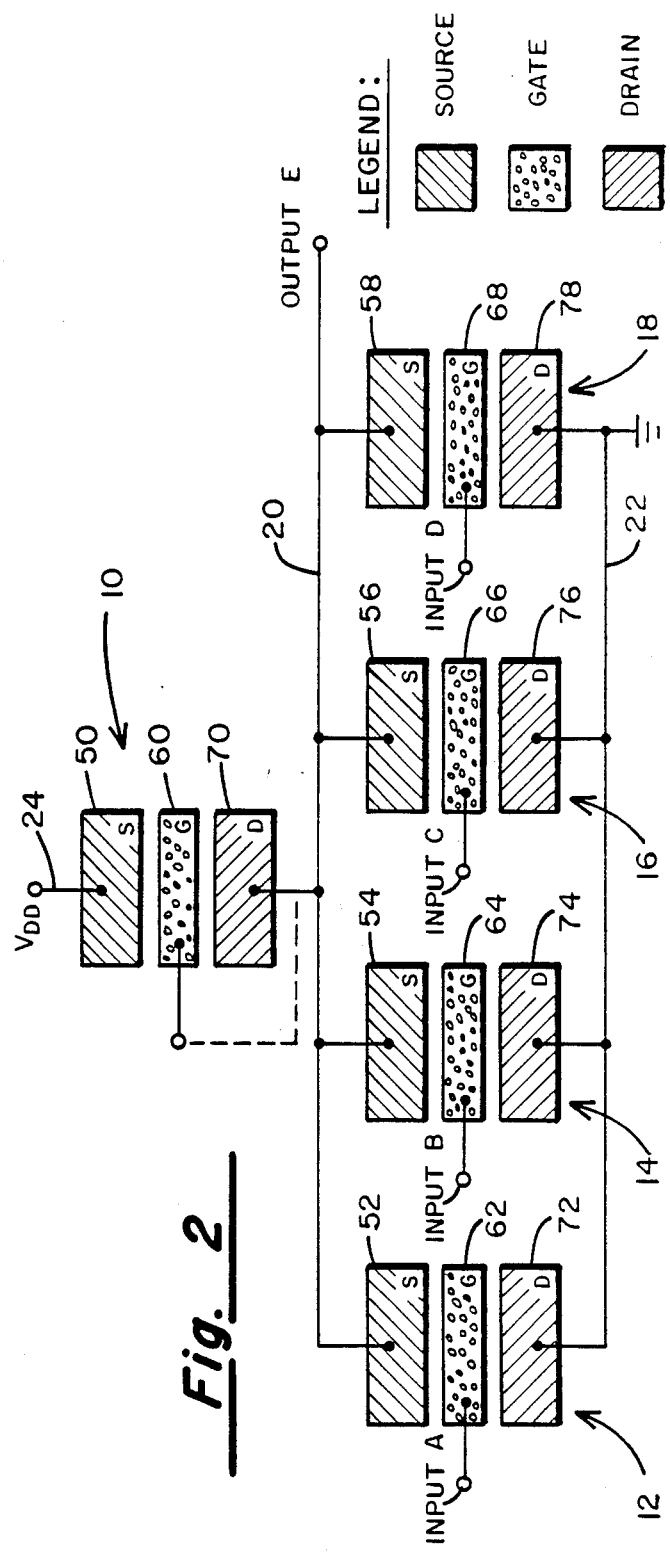
FIG. 2 is a quasi-topological version of the schematic diagram of FIG. 1.
Figure 4:
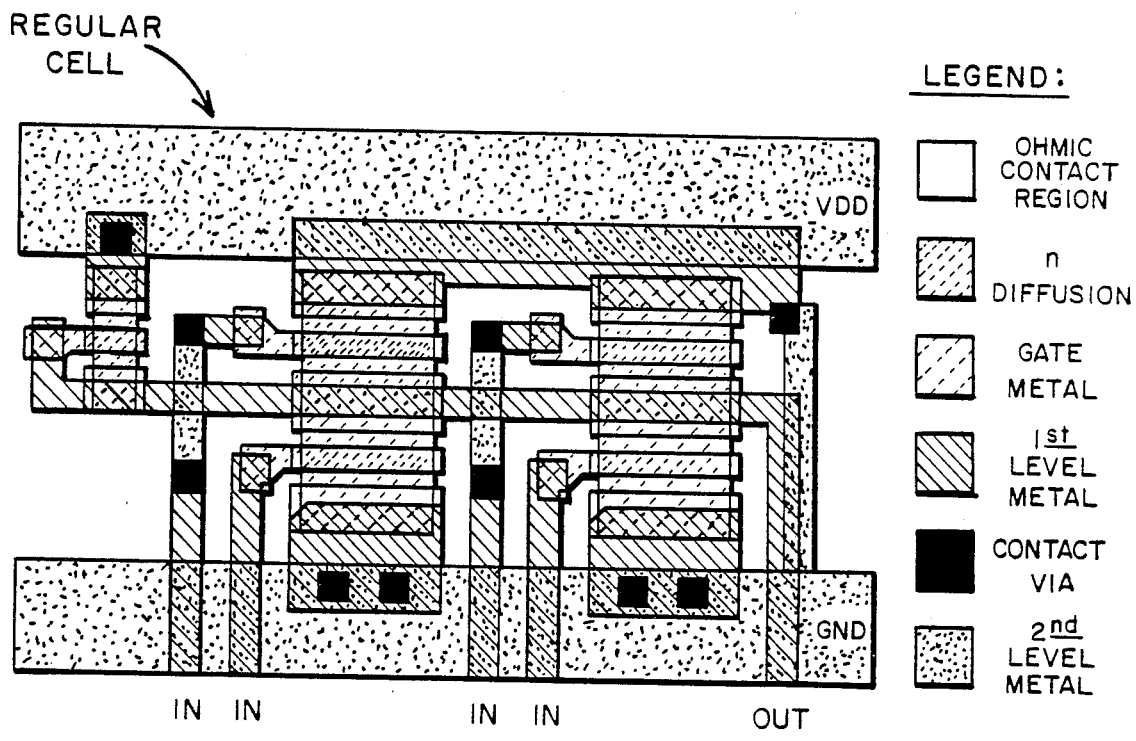
FIG. 4 is a composite of the layout mask used to photolithographically pattern the circuit of FIG. 1 when using prior art topology.

FIG. 2 illustrates the topology commonly used in implementing the logic circuit of FIG. 1 showing how that circuit would be conventionally realized in integrated circuit form. The key to the right of the drawing illustrates the shading used to identify the source, gate and drain regions. It is to be noted that a separate region is provided for each element of each FET. More particularly, source regions 50 through 58 correspond to the sources of FET's 10 through 18 of FIG. 1, respectively. The same relationship holds for gates 60–68 and for drains 70–78. FIG. 2 is referred to as a quasi-topographical schematic diagram in that the source, gate and drain electrodes would not necessarily be physically located as depicted in FIG. 2. Instead, FIG. 4 provides a more accurate depiction of the topographical layout of the circuit of FIG. 1 when reduced to integrated circuit form in accordance with prior art techniques.

Figure 3:
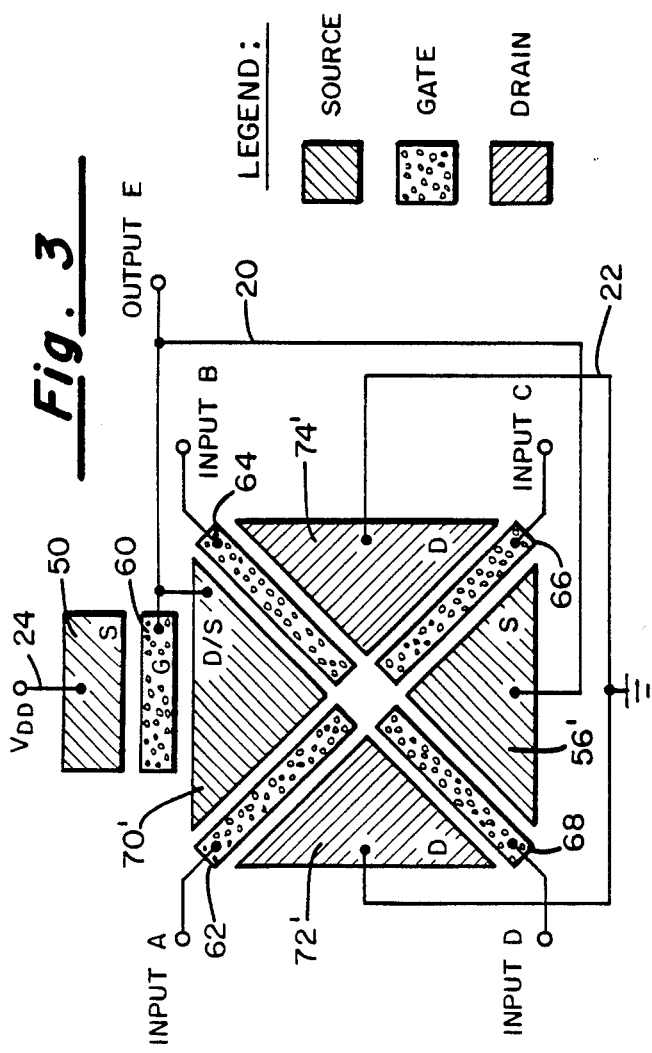
FIG. 3 is a quasi-topological schematic of the circuit of FIG. 1 but implemented using the ring topology of the present invention.

To contrast the ring topography of the present invention with that prior art approach, FIG. 3 presents a similar quasi-topographical schematic of the circuit of FIG. 1 but when the ring topology is utilized. Sources 52 and 54 of FIG. 2 have been merged with the drain region 70 of FIG. 2 to form the merged drain/source contact region 70' of FIG. 3. Similarly, the drain region 78 has been merged with drain region 72 to form the drain contact region 72' in FIG. 3 while the source region 58 of FIG. 2 has been merged with the source region 56 of FIG. 2, to form the source contact region 56' in FIG. 3. Finally, drain regions 74 and 76 of FIG. 2 have been merged in forming drain contact regin 74' in FIG. 3.

By observing FIG. 3, the simplification resulting from the use of the ring topography becomes immediately apparent, especially in the manner in which the individual gates are interconnected. The ground conductor 22 contacts only two regions instead of the previous four while output conductor 20 contacts only three regions instead of the previous six. While the schematic in FIG. 3 depicts the ring topology as applied to a four-input NOR logic cell, those skilled in the art will recognize that the concept can readily be extended to a configuration having a greater or fewer number of inputs. As the number of inputs is increased, the wedged shape of the merged source/drain contact regions becomes more acute.

The present invention thus relates to a circuit topology and it is to be recognized that this topology would be applicable to a wide range of materials and processes. In the preferred embodiment being described, the FET transistors are preferably metal semiconductor field effect transistors (MESFET) formed in a compound semiconducting material such as gallium arsenide. The channels for the FET's are formed through selective ion implantation of N-type impurities using the so-called "self-aligned gate" method. In the first step, the channel is created by means of ion implantation at a small dosage, resulting in a shallow implant over the entire channel region. The gate electrode is then deposited and a larger dosage of ions is implanted into the source and drain regions, with the metal of the gate serving as a mask to protect the active portion of the channel. This results in a relatively deep and relatively highly doped channel in all regions, except directly under the gate, resulting in a more conductive FET. The operating mode of the FET transistor, i.e., depletion mode or enhancement mode, is determined by the depth of the first shallow ion implantation. Separate implantation steps are used such that the load FET corresponding to transistor 10 of FIG. 1 is a depletion mode transistor while all other transistors are of the enhancement mode type. The gate material system is chosen to form a rectifying contact, i.e., a Schottky barrier, at the interface between the metal and the semiconductor. Metal systems, such as chromium, platinum or gold may be used. All other interconnecting metal may be titanium/gold. At the interface between the source or drain and the semiconductor channel, it is necessary to form an ohmic contact. This can be accomplished with a AuGe metal interface or alternatively, by heavily doping the channel region directly under the drain or the source.

FIG. 4 is a composite of the layout masks which would be used to photolithographically pattern a four-input NOR gate using conventional, prior art topology. The key accompanying FIG. 4 identifies various regions of the device, each region defined by a separate photolithographic mask, i.e., the ohmic contact region, the N-type diffusion region, the gate region, first level metal, contact via, and second level metal. The contact via represents an aperture in the insulating layer separating the two levels of metal to allow inter-level connection. the layout depicted in FIG. 4 is to an arbitrary scale and observe uniform design layout rules required for producability, i.e., minimum conductor width and spacing.

Figure 5:
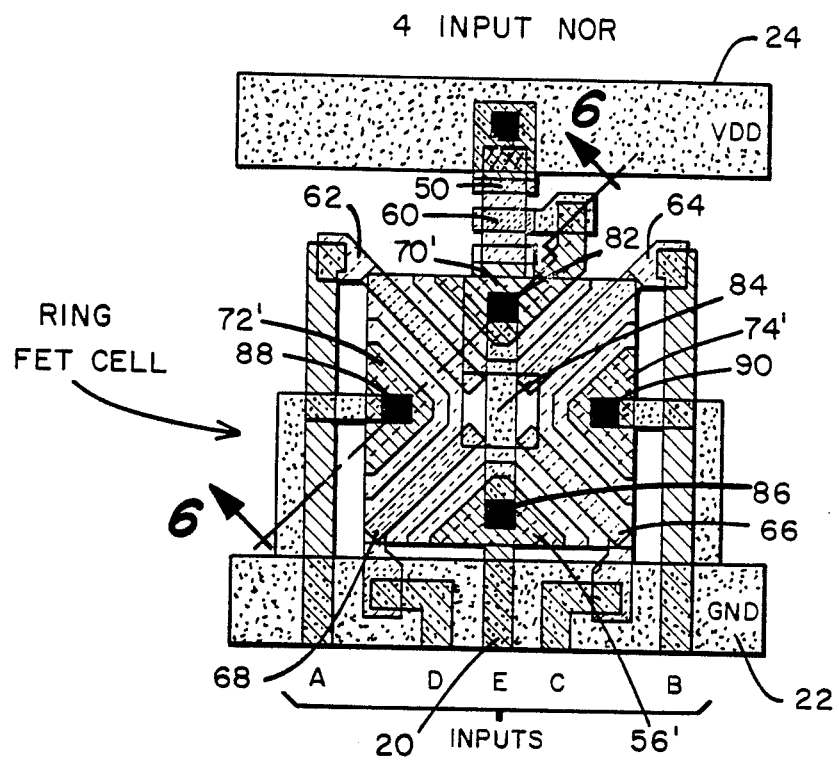
FIG. 5 is a composite layout of the photolithographic masks for the same four-input NOR circuit but using the ring topology.

FIG. 5 shows a similar composite layout of photolithographic masks for fabricating the identical four-input NOR circuit, but using the ring topology of the present invention. With this topology, the area required for the cell has been reduced by 40% using comparable design rules. The contact regions of FIG. 5 correspond to the circuit diagram of FIG. 3. Connection between ground conductor 22 and the drain contact regions 72' and 74' are provided by the vias 88 and 90, respectively. Interconnection between output conductor 20 and regions 60, 70' and 56' is provided by vias 82 and 86 which, in turn, provide a contact to line 84 in the second metal level.

Figure 6:
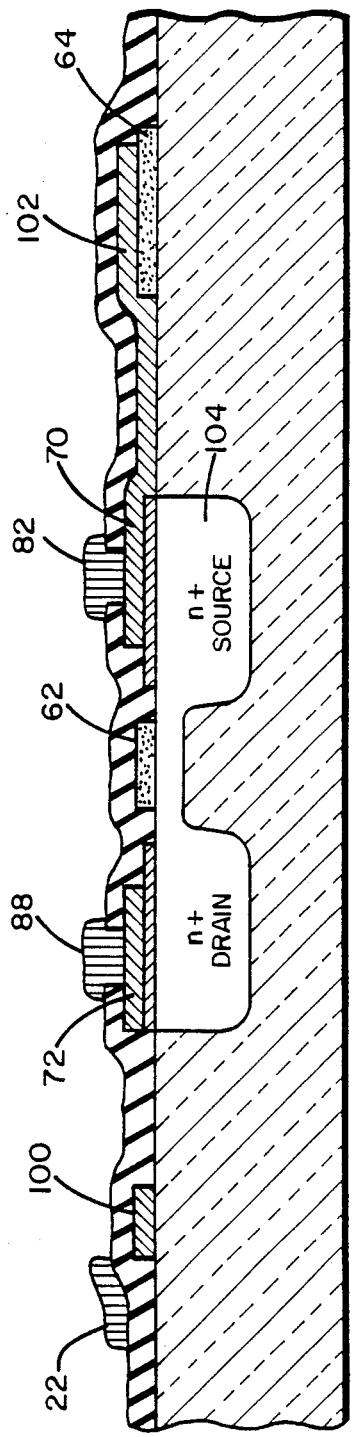
FIG. 6 is a cross-section taken along line 6—6 in FIG. 5.

To better illustrate the topology employed, FIG. 6 shows a cross-section taken along section line 6—6 in FIG. 5. At the center of the diagram of FIG. 6 is a cross-section of the FET associated with input A. Channel 104 is formed by the aforementioned self-aligned gate ion implantation process. Shown on the left side of the diagram is a conductor 100 which comprises the input A conductor of FIG. 5 and, as can be seen, it is at the first metal level while the ground conductor 22 is shown at the second level of metal. On the right side in FIG. 6 there is shown the connection between gate contact 64 which is associated with the gate of input B which is making contact to the conductor for input B 102 on the first level of metal.

Figure 7:
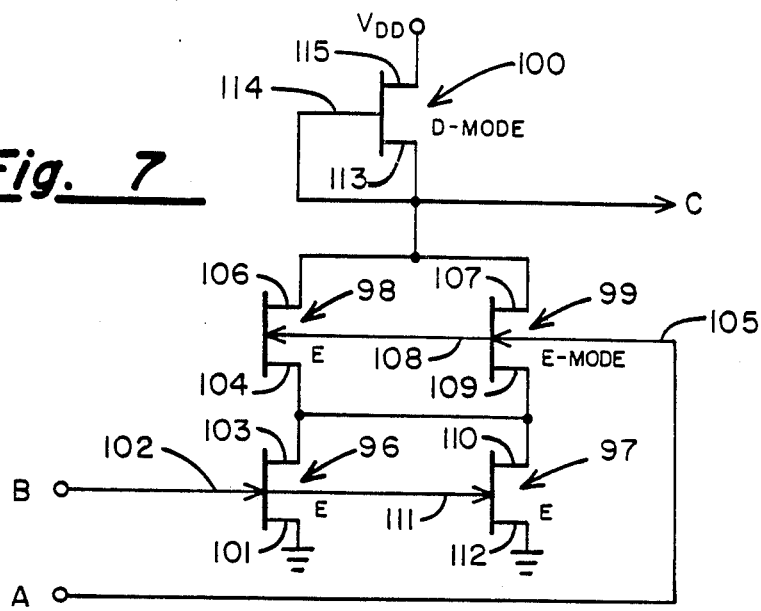
FIG. 7 is a schematic diagram of a conventional two-input NAND gate.

While FIGS. 5 and 6 depict a 4-input of NOR gate, where process limitations do not restrict, by substituting p-type doping for ntype doping in the source and drain regions, p-channel depletion mode transistors result and the same circuit topology and inner arrangement creates a 4-input NAND gate. If, on the other hand, process limitations preclude the substitution of p-type doping for n-type doping in the manner suggested above, a 2-input NAND gate can also be realized using the ring topology and n-type doping for the source and drain regions. To illustrate this, FIG. 7 is a schematic diagram of a conventional 2-input NAND gate using MESFET technology. It performs the Boolean logic function C=$\overline{AB}$. Field effect transistor 100 is designed to operate in the depletion mode and, hence, the gate 114 thereof can be connected directly to the conductor on which the output signal is developed. If a logical "0" is present at any one of the gate inputs A or B of FETs 99 and 96, the output C will be a logical "1". Only if both inputs A and B are high will the output C be low.

Figure 8:
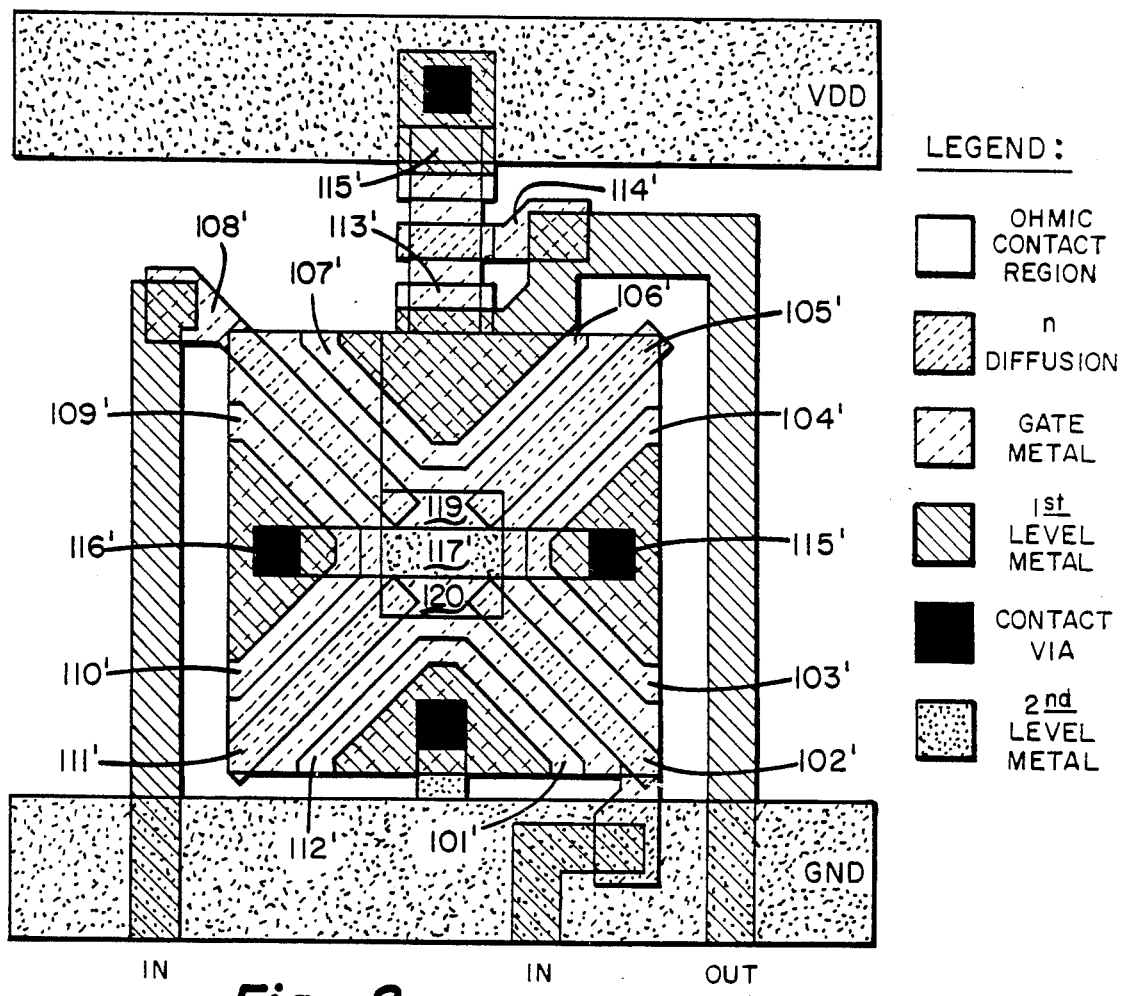
FIG. 8 is a quasi-topological schematic of the circuit of FIG. 7, but implemented using the ringtopology of the present invention.

Referring next to FIG. 8, there is shown the manner in which the ring topology can be used to implement the NAND logic cell depicted schematically in FIG. 7. In FIG. 8, the same identifying numerals as used in FIG. 7 refer to the corresponding source, drain and gate electrodes as in FIG. 7 but to distinguish them, they are primed in FIG. 8. Thus, it can be seen that FETs 97 and 99 share a common source and drain contact region 109' and 110' while FETs 96 and 98 likewise share a common source/drain contact region 103' and 104'. The drain contact region 113' of FET 100 is shared with the common source regions 106' and 107' of FETs 98 and 99. The drain contact regions 101' and 112' of FETs 96 and 97 are tied to ground while input A connects to gate contact 108' and input B connects to gate 102'. A layer of metalization 117' and vias 116' and 115' join the source/drain regions 109' and 110' to the source/drain regions 103' and 104' in the fashion illustrated. Likewise, gate metal segment 119 connects gate regions 105' and 108', and gate metal segment 120 connects gate regions 102' to 111'.

There has been shown and described an improved topological layout for a digital logic cell to be realized using VLSI techniques. Those skilled in the art, having had the benefit of the teachings herein, will be in a position to apply the principles in fabricating logic cells having a greater number of inputs than four, it being observed that the topology of the present invention lends itself more readily to devices having an even number of inputs. Also, while the invention has been particularly described using MESFET technology, it is also envisioned that the topological arrangement can be implemented using MOSFET technology on a silicon substrate.

The invention has been described herein in considerable detail, in order to comply with the Patent Statutes, and to provide those skilled in the art with information needed to apply the novel principles, and to construct and use such specialized components as are required. However, it is to be understood that the invention can be carried out by specifically different equipment and devices and that various modifications, both as to equipment details and operating procedures can be effected without departing from the scope of the invention itself.

What is claimed is:

1. A multi-input Boolean logic cell comprising:
    (a) at least n integrated circuit field effect transistors formed on a common semi-insulating substrate, n being the integer of two or more, each field effect transistor including a source contact region and a drain contact region separated by a gate region, the source contact region of one field effect transistor being shared by the source contact region of a next adjacent field effect transistor and the drain contact region of said one field effect transistor being shared by a drain contact regions of a next adjacent field effect transistor to form a ring:
    (b) a current bias field effect transistor formed on said common insulating substrate, said current bias field effect transistor having a source region and a drain contact region separated by a gate region, said drain contact region of said current bias field effect transistor being the source contact region of two of said field effect transistors in said ring;
    (c) input terminal means connected individually to selected ones of the gate regions of said field effect transistors in said ring; and
    (d) output terminal means connected to selected ones of the source contact regions of the field effect transistors in said ring.

2. The logic cell as in claim 1 wherein said field effect transistors are metal semiconductor field effect transistors wherein said semi-insulating substrate is gallium arsenide.

3. The logic cell as in claim 1 wherein all of said drain contact regions of said FETs in said ring are electrically connected to a point of fixed potential.

4. The logic cell as in claim 1 wherein said current bias FET is a depletion mode transistor and said n field effect transistors comprising said ring are enhancement mode transistors.

5. Apparatus as in claim 3 wherein said cell is a NOR logic gate comprising:
    first connecting means, formed on said common insulating substrate, for connecting all of said source contact regions of said FETs in said ring to said output terminal means; and second connecting means, formed on said common insulating substrate, for connecting all of said gate regions on a one-to-one correspondence of said input terminal means.

6. Apparatus as in claim 2 wherein said cell is a NAND logic gate comprising:
   first connecting means, formed on said common insulating substrate, for connecting all of said gate regions except one gate region of said FETs forming said ring, to said input terminal means on a one-to-one correspondence wherein each of said regions adjacent to each of said gate regions is a source contact region for one FET and a drain contact region for another FET;
   second connecting means, formed on said common insulating substrate, for connecting a drain contact region of a FET having said except one gate region, to a first point of fixed potential;
   third connecting means, formed on said common insulating substrate, for connecting said gate region of said current bias FET, to a source contact region of said FET having said except one gate region, wherein said source contact region of said FET having said except one gate region is said drain contact region of said current bias FET; and
   fourth connecting means, formed on said common substrate, for connecting said source contact region of said current bias FET to a second point of fixed potential.

7. Apparatus as in claim 4 wherein said n field effect transistors comprising said ring are n-channel devices.

8. Apparatus as in claim 4 wherein said n field effect transistors are p-channel devices.

9. The logic cell as in claim 2 wherein said field effect transistors are metal-oxide silicon field effect transistors wherein said semi-insulating substrate is silicon.

10. The logic cell as in claim 1 wherein the gate regions of a first pair of adjacent field effect transistors in said ring are connected to one another and the gate regions of a second pair of field effect transistors in said ring are connected to one another.

11. The logic cell as in claim 10 wherein the drain contact regions of each field effect transistor in said first pair of field effect transistors are connected to the source contact regions of each field effect transistor in said second pair of field effect transistors.

12. The logic cell as in claim 11 wherein said input terminal means connect separately to one of said gate regions of said first pair of adjacent field effect transistors in said ring and to one of said gate regions of said second pair of adjacent field effect transistors in said ring.

13. A multi-input NOR logic gate integrated in a substrate of a second conductivity type comprising:
   a first plurality of regions of a second conductivity type on said substrate;
   a second plurality of regions of the second conductivity type on said substrate, each region located adjacent to the and between two regions of said first plurality such that said regions of said first and second pluralities are arranged in alternate order in an approximately circular pattern;
   first connecting means on said substrate for connecting every other region of said first plurality to one another;
   second connecting means on said substrate for connecting remaining regions of said first plurality not connected by said first connecting means;
   an output node on said substrate connected to said first connecting means;
   a zero voltage reference potential node on said substrate connected to said second connecting means;
   a plurality of input nodes on said substrate;
   third connecting means on said substrate for connecting each input node of said plurality of input nodes on a one-to-one correspondence to each region of said second plurality of regions;
   a voltage potential node on said substrate; and
   an electrical load on said substrate coupling said first connecting means to said voltage potential node.

14. Apparatus of claim 13 wherein said electrical load comprises:
   a first region on said substrate adjacent to only one region of said every other region of said first plurality of regions connected by said first connecting means;
   connecting means on said substrate for connecting said first region to said only one region of said every other region of said first plurality of regions connected by said first connecting means; and
   a second region on said substrate, adjacent to said first region, connected to said voltage potential node.

15. Apparatus of claim 14 wherein:
   said each region of said first plurality of regions, connected to said output node, is a source for at least two corresponding logic field effect transistors;
   said each region of said first plurality of regions, connected to said zero voltage reference potential node, is a drain for at least two corresponding field effect transistors;
   said each region of said second plurality of regions is a gate for at least one corresponding logic field effect transistor;
   said only one region of said first plurality of regions connected to said output node is a drain for a load field effect transistor;
   said first region of said electrical load is a gate for said load field effect transistor; and
   said second region of said electrical load is a source for said load field effect transistor.

16. Apparatus of claim 15 wherein said substrate is gallium arsenide.

17. A multi-input NAND logic gate integrated in a substrate of a first conductivity type comprising:
   a first plurality of regions of a second conductivity type on said substrate;
   a second plurality of regions of the second conductivity type on said substrate, each region positioned in each location, except for one, adjacent to and between proximate regions of said first plurality, but for two regions which remain adjacent to each other of said first plurality, such that said regions of said first and second pluralities are in alternate order and together arranged in an approximately circular pattern;
   a plurality of inputs on said substrate;
   first connecting means on said substrate for connecting each region of said second plurality of regions on a one-to-one correspondence to each input of said plurality of inputs;
   a zero voltage reference node on said substrate;
   second connecting means on said substrate for connecting a first region of said two regions which remain adjacent to each other of said first plurality of regions, to said zero voltage reference node;

an output node on said substrate;

third connecting means on said substrate for connecting a second region of said two regions which are adjacent to each other of said first plurality of regions, to said output node;

a voltage potential node on said substrate; and an electrical load on said substrate coupling said third connecting means to said voltage potential node.

18. Apparatus of claim 17 wherein said electrical load comprises:

a third region on said substrate adjacent to said second region of said two regions which are adjacent to each other of said first plurality of regions;

connecting means on said substrate for connecting said third regions to said second region of said two regions which are adjacent to each other; and a fourth region on said substrate adjacent to said third region, connected to said voltage potential node.

19. Apparatus of claim 18 wherein:

each of said regions except for said two adjacent regions of said first plurality of regions is a drain of one field effect transistor and is a source of another field effect transistor resulting in said field effect transistors connected in series at said drain and said source;

each of said regions of said second plurality of regions is a gate of each of said series connected field effect transistors;

said third region of said electrical load is a gate of a load field effect transistor;

said second region of said two adjacent regions of said first plurality of regions is a source of said load field effect transistor; and said fourth region adjacent to said third region is a drain of said load field effect transistor.

20. Apparatus of claim 19 further comprising third and fourth pluralities of regions on said substrate wherein said third plurality of regions is configured like said first plurality of regions and said fourth plurality of regions is configured like said second plurality of regions, said third and fourth pluralities of regions are connected with each other and to said input nodes, to said zero voltage reference node, to said output node, and to said electrical load, respectively, like said first and second pluralities, and said third and fourth pluralities are parallelly interconnected such that field effect transistors composed of said third and fourth pluralities of regions have drains, sources and gates each connected one-to-one to corresponding drains, sources and gates of respective said transistors composed of said first and second pluralities of regions.

21. Apparatus of claim 20 wherein said substrate is gallium arsenide.

* * * * *

UNITED STATES PATENT AND TRADEMARK OFFICE
CERTIFICATE OF CORRECTION

PATENT NO. : 4,737,837
DATED : April 12, 1988
INVENTOR(S) : GARY M. LEE

It is certified that error appears in the above-identified patent and that said Letters Patent is hereby corrected as shown below:

Column 6, line 41, after "source" insert --contact--.

Column 7, line 54, delete "second" and replace with --first--.

Signed and Sealed this

Thirteenth Day of September, 1988

Attest:

DONALD J. QUIGG

*Attesting Officer*  *Commissioner of Patents and Trademarks*